(12) United States Patent
Funabashi et al.

(10) Patent No.: US 6,728,288 B2
(45) Date of Patent: Apr. 27, 2004

(54) DFB SEMICONDUCTOR LASER DEVICE

(75) Inventors: Masaki Funabashi, Tokyo (JP);
Satoshi Arakawa, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 258 days.

(21) Appl. No.: 09/987,536

(22) Filed: Nov. 15, 2001

(65) Prior Publication Data

US 2002/0101896 A1 Aug. 1, 2002

(30) Foreign Application Priority Data

Jan. 31, 2001 (JP) ........................................ 2001-023535
Aug. 22, 2001 (JP) ........................................ 2001-251110

(51) Int. Cl.[7] ............................................... H01S 5/12
(52) U.S. Cl. ............................................................ 372/96
(58) Field of Search ............................................. 372/96

(56) References Cited

U.S. PATENT DOCUMENTS 6,337,868 B1 * 1/2002 Mizutani ..................... 372/27
2002/0009116 A1 * 1/2002 Kobayashi et al. ........... 372/96

* cited by examiner

*Primary Examiner*—James Davie
(74) *Attorney, Agent, or Firm*—Oblon, Spivak, McClelland, Maier & Neustadt, P.C.

(57) ABSTRACT

A distributed feedback (DFB) semiconductor laser device has a multiple-quantum-well (MQW) structure and a diffraction grating formed in the MQW structure. The diffraction grating includes a grating structure formed in QW layers and a barrier layer of the MQW structure and an embedded layer embedded in the grating structure. One of the QW layers and the barrier layers has an etching rate lower than the etching rate of the other layers of the MQW structure and functions as an etching stop layer during etching of the MQW structure for forming the diffraction grating.

12 Claims, 5 Drawing Sheets

DFB SEMICONDUCTOR LASER DEVICE

BACKGROUND OF THE INVENTION (a) Field of the Invention

The present invention relates to a distributed feedback (DFB) semiconductor laser device and more particularly, to a DFB semiconductor laser device including a diffraction grating which can be formed with excellent controllability and excellent reproducibility as well as in-plane uniformity over an entire wafer surface. The present invention also relates to a method for fabricating such a DFB semiconductor laser device.

(b) Description of the Related Art

A DFB semiconductor laser device (referred to as simply DFB laser or DFB laser device, hereinafter) has a selection property for the emission wavelength thereof by using a feedback loop for effecting a selective feedback of a specified wavelength. The selective feedback is achieved by a diffraction grating which provides the laser active layer with a periodic spatial structure, wherein either the real part or the imaginary part of the complex refractive index of the laser device changes periodically with the location. The DFB laser operates at an excellent single mode, can emit laser of a stable single wavelength, and thus is widely used as the light source in optical communication systems.

The diffraction grating of the DFB laser is disposed in the vicinity of the active layer of the DFB laser and includes a grating layer having a periodic refractive index which is different from the refractive index of the adjacent layers. The emission wavelength $\lambda_{DFB}$ of the DFB laser is determined by the formula $\lambda_{DFB}=2n_{eff}\Lambda$, wherein $\Lambda$ is the spatial period of the diffraction grating and $n_{eff}$ is the effective refractive index of the waveguide of the laser device. Thus, the emission wavelength $\lambda_{DFB}$ can be determined independently of the peak wavelength of the optical gain of the active layer. The DFB laser is categorized into two types including a refractive-index coupling type and a gain coupling type based on the material of the diffraction grating.

A DFB laser of the refractive-index coupling type has a diffraction grating made of a transparent material which allows the emission wavelength to path therethrough, wherein the real part of the complex refractive index changes periodically with location in the laser device.

On the other hand, a DFB laser of the gain coupling type has a structure wherein the imaginary part of the complex refractive index changes periodically with location in the laser device. The gain coupling type is again categorized into three subtypes including a first subtype (or gain grating type) wherein the diffraction grating is formed in the active layer structure itself to obtain a periodic gain distribution with respect to location, a second subtype (or absorption grating type) wherein a material for absorbing the emission wavelength is periodically disposed in the vicinity of the active layer to obtain a periodic absorption distribution with respect to location, and a third subtype (or current blocking type) wherein a material for blocking the injection current is periodically disposed in the vicinity of the active layer to obtain a periodic carrier density distribution with respect to location.

The gain grating type has a higher gain-coupling coefficient, whereby it is expected that the gain grating type achieves a higher product yield in fabrication of a single mode laser device. In addition, since a DFB laser of the gain grating type generally operates with an in-phase mode at a longer wavelength of the Bragg's wavelengths, it is also expected that the gain distribution has an advantage of maintaining a stable single mode even at a higher injection current.

The gain grating type DFB laser is expected for use as a light source in an optical communication system due to the advantage of higher coupling coefficients, which are important parameters of the DFB laser, as described above, especially due to the advantage of the higher gain coupling coefficient.

However, there is a problem in the reproducibility and the controllability of the gain coupling coefficient in the gain grating type DFB laser device, resulting from the poor controllability of etching during the etching of the active layer structure to form the diffraction grating therein. This problem causes a poor product yield in fabrication of the DFB laser devices having an accurate coupling coefficient as designed.

More specifically, since the diffraction grating is formed by etching the active layer structure in the gain grating type DFB laser, the etching accuracy in the active layer structure significantly affects the coupling coefficient and the laser characteristics, which may have larger dispersions. A smaller coupling coefficient degrades the wavelength selectivity, whereby a multi-mode lasing occurs in the DFB laser. On the other hand, a large coupling coefficient increases the probability for occurrence of a spatial-hole-burning in the longitudinal direction of the laser device, whereby the operation at a higher injection current becomes unstable.

In this respect, it is to be noted that the electric field of the light assumes a maximum in the vicinity of the active layer, which in general constitutes the core of the waveguide. Thus, the diffraction grating formed in the active layer structure wherein the electric field of the light assumes the maximum causes the problem that the poor etching accuracy in the active layer affects the accuracy of the coupling coefficient. Even a small deviation in the thickness of the diffraction grating due to the poor etching accuracy significantly changes the coupling coefficient.

In particular, in the case of an active layer scheme having a multiple quantum well (MQW) structure, it is difficult to accurately control the etching depth in the current etching technique, and thus it is difficult to form a diffraction grating having accurate dimensions based on the design thereof.

Recently, it is common to employ an active layer scheme having the MQW structure in order to improve the laser characteristics, the MQW structure being such that a plurality of quantum well layers each having a thickness around 5 nm and a plurality of barrier layers each having a thickness around 10 nm are alternately layered. When a diffraction grating is formed in the MQW active layer structure by etching thereof, it is difficult to accurately control the etching depth or the resultant height of the grooves in the diffraction grating. In particular, it is difficult to obtain an in-plane uniformity of the etching depth for the MQW active layer structures over the entire wafer surface. This degrades the product yield of the gain grating type DFB lasers.

SUMMARY OF THE INVENTION

It is therefore an object of the present invention to provide a gain-coupling DFB semiconductor laser device of the gain grating type, which has excellent in-plane uniformity over the wafer surface and can be fabricated with an excellent product yield.

The present inventors noted that the controllability, reproducibility and in-plane uniformity of the diffraction grating could be improved by incorporating a compound semiconductor layer within the active layer structure, the compound semiconductor layer acting as a quantum well layer or a barrier layer in the MQW active layer structure as well as acting as an etching stop layer for the etching of the MQW active layer structure. The present invention is based on this principle.

Thus, the present invention provides a DFB laser device including a compound semiconductor substrate, a multiple-quantum-well (MQW) active layer structure overlying the compound semiconductor substrate and including a plurality of quantum well (QW) layers and at least one barrier layer, and a diffraction grating including a grating layer structure and an embedded layer embedded in the grating layer structure, the grating layer structure including at least one of the QW layers and the barrier layer of the MQW active layer structure, the embedded layer having a composition different from a composition or compositions of the QW layers, the QW active layer structure including an etching stop layer underlying the diffraction grating in contact therewith.

The present invention also provides a method for fabricating a DFB laser device including the steps of: forming a MQW active layer structure overlying a compound semiconductor substrate and including a plurality of quantum well (QW) layers and at least one barrier layer, one of the QW layers and the at least one barrier layer constituting an etching stop layer; and etching a portion of the MQW active layer structure overlying the etching stop layer in contact therewith to form a diffraction grating in the portion of the MQW active layer structure, the etching stop layer having a lower etching rate compared to an etching rate or etching rates of the portion of the MQW active layer structure during the etching.

In accordance with the DFB laser of the present invention and the DFB laser device fabricated by the method of the present invention, the provision of the etching stop layer in the MQW active layer structure improves the in-plane uniformity of the etching depth in the active layer structure for forming the diffraction grating, whereby the in-plane uniformity of the laser characteristics and thus the product yield of the DFB laser devices of the gain grating type can be improved.

PREFERRED EMBODIMENTS OF THE INVENTION

Figure 1:
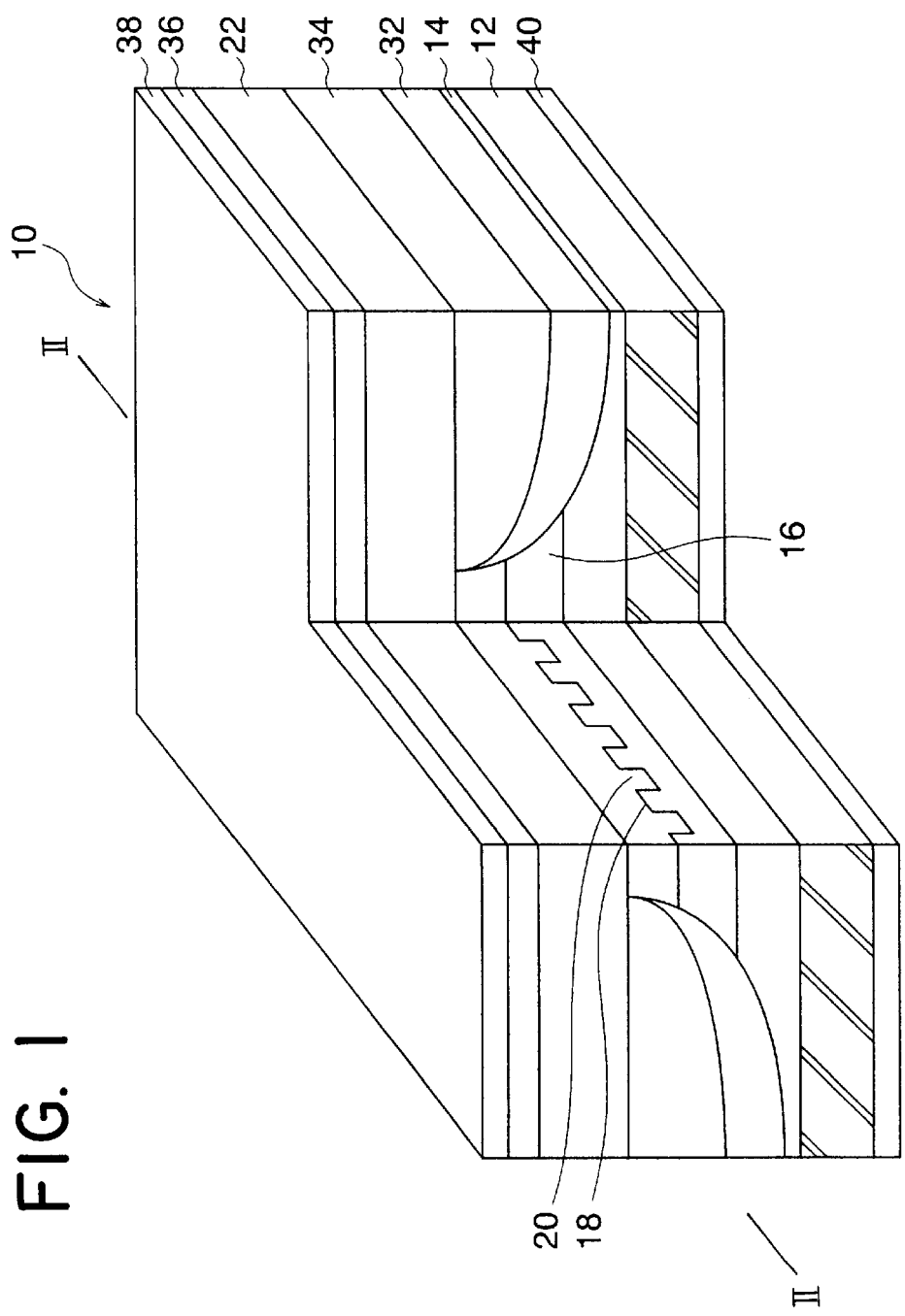
FIG. 1 is a perspective view of a DFB laser device according to an embodiment of the present invention.
Figure 2:
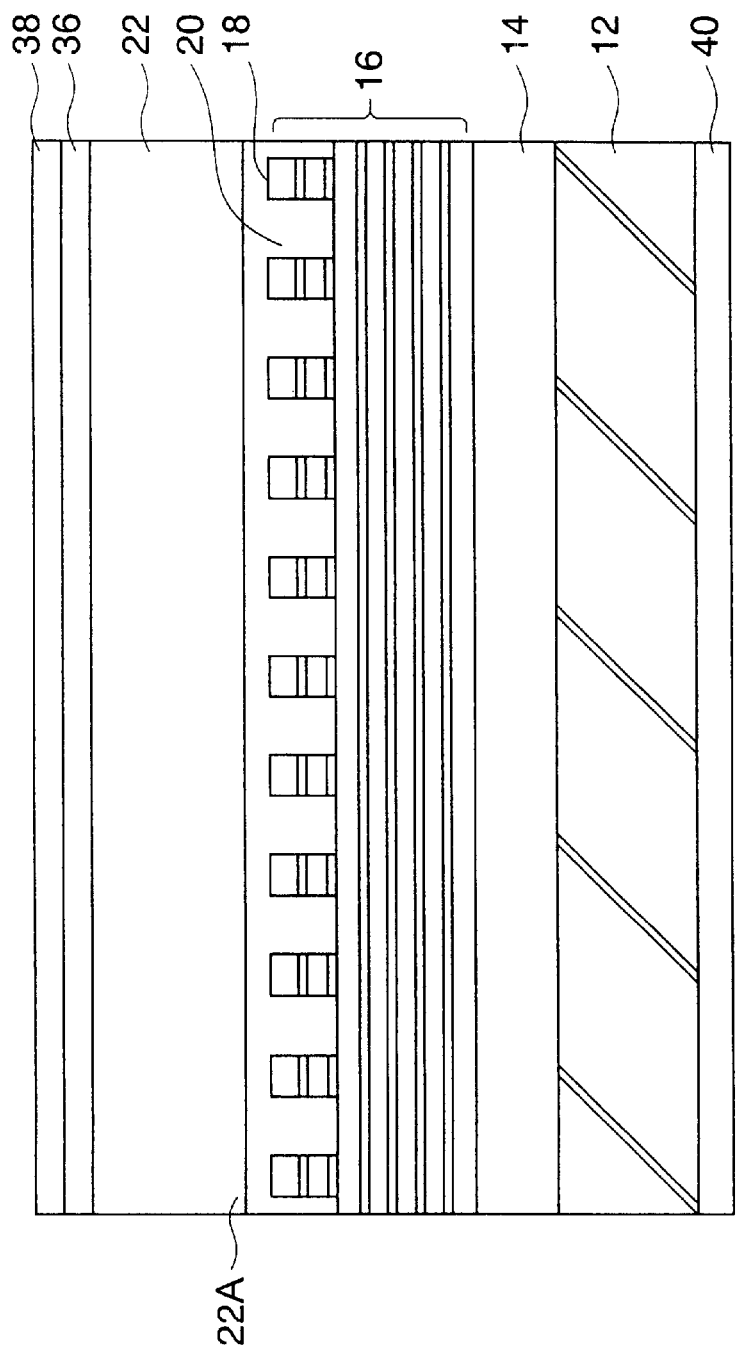
FIG. 2 is a sectional view of the DFB laser device of FIG. 1 taken along line II—II in FIG. 1.

Referring to FIGS. 1 and 2, a DFB laser device, generally designated by numeral 10, according to an embodiment of the present invention has a diffraction grating formed in the active layer structure and has an emission wavelength of 1550 nm. The DFB laser 10 includes an n-type InP (n-InP) compound semiconductor substrate 12 having a thickness of 120 $\mu$m, and a layer structure formed on the n-InP substrate 12. The layer structure includes, consecutively as viewed from the bottom, an n-InP buffer layer 14, a MQW separate confinement heterostructure (MQW-SCH) active layer structure 16 having a diffraction grating 18 formed in the top portion of the MQW active layer structure 16, and a p-InP embedded layer 20 embedded in the diffraction grating 18.

Figure 3:
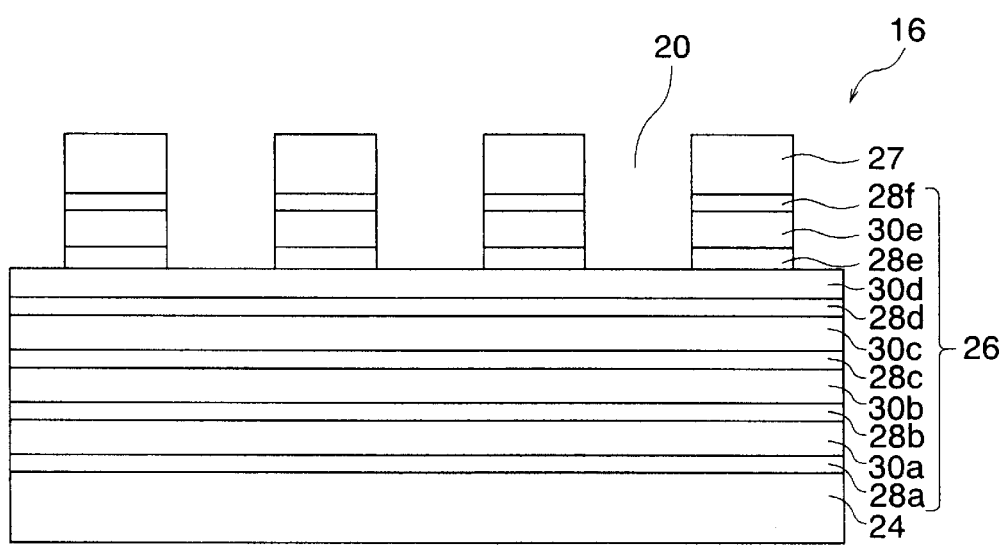
FIG. 3 is a sectional view of the MQW active layer structure shown in FIG. 2.

Referring to FIG. 3, the MQW-SCH active layer structure 16 includes a bottom SCH layer 24 made of InGaAsP having a bandgap wavelength of 1.2 $\mu$m, a MQW layer body 26, and a top SCH layer 27, which is made of InGaAsP having a bandgap wavelength of 1.2 $\mu$m similarly to the bottom SCH layer 24.

The MQW layer body 26 includes a plurality of (six, in this example) InGaAs QW layers 28a to 28f each having a compressive strain of 1% and a thickness of 4 nm, and a plurality of (five, in this example) barrier layers 30a to 30e, which are respectively interposed between two of the InGaAs QW layers. The fourth-level barrier layer 30d, as viewed from the bottom, is made of AlGaInAs having a bandgap wavelength of 1.2 $\mu$m, i.e., has an Al component therein. The first through third barrier layers 30a to 30c and the fifth barrier layers 30e are made of InGaAsP having a bandgap wavelength of 1.2 $\mu$m, i.e., are free from Al component. The MQW layer body 26 has a peak-gain wavelength of about 1550 $\mu$m.

The diffraction grating 18 includes a grating structure formed in the top portion of the MQW layer structure 16 and the InP embedded layer 20 embedded in the grating structure. The grating structure is formed in the fifth QW layer 28e, fifth barrier layer 30e, sixth QW layer 28f and the top SCH layer 27, as clearly shown in FIGS. 2 and 3.

The AlGaInAs barrier layer 30d has a considerably lower etching rate due to the Al content thereof compared to the etching rates of the InGaAsP top SCH layer 27, the InGaAs QW layers 28 and the InGaAsP barrier layers 30a to 30c and 30e, during a dry etching process using a mixture of methane and hydrogen as an etching gas for forming the diffraction grating 18. Thus, the AlGaInAs barrier layer 30d functions as an etching stop layer during the etching process for forming the diffraction grating. This affords and ensures excellent in-plane uniformity of the depth of the diffraction grating 18 over the entire semiconductor wafer on which a multiple of DFB laser devices are formed.

The p-InP embedded layer 20, MQW-SCH active layer structure 16 having therein the diffraction grating 18, and the top portion of the InP buffer layer 14 are configured as a mesa stripe having an active layer width of about 1.5 $\mu$m. Both the sides of the mesa stripe are buried with a pair of currrent blocking structures each including, consecutively as viewed from the bottom, a p-InP layer 32 and an n-InP layer 34 which form in pair a p-n junction.

On the top surfaces of the p-InP embedded layer 20 and the n-InP layer 34, a p-InP cladding layer 22 and a heavily doped GaInAs cap layer 36 are formed. The cap layer 36 affords an electrical contact with a metallic electrode 38.

On the top surface of the GaInAs cap layer 36, a Ti/Pt/Au multilayer metallic film structure is formed as a p-side electrode 38, whereas an AuGeNi metallic film is formed as an n-side electrode 40 on the bottom surface of the n-InP substrate 12.

Although not illustrated, a high-reflection (HR) coat is formed on the rear facet of the DFB laser 10 for laser reflection, whereas a anti-reflection (AR) coat is formed on the front facet of the DFB laser 10 for laser emission.

Figure 4A:
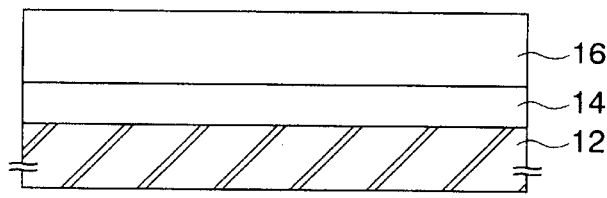
FIGS. 4A to 4G are sectional views of the DFB laser shown in FIG. 1, showing fabrication steps of fabrication thereof and detail of the layer structure therein.

A fabrication process for the DFB laser of FIG. 1 is now described with reference to FIGS. 4A to 4G. First, as shown in FIG. 4A, the n-InP buffer layer (or lower cladding layer) 14 and the MQW-SCH active layer structure 16 are epitaxially grown on the n-InP substrate 12 by using a MOCVD technique at a temperature of 600° C., for example, thereby forming the layer structure.

Figure 4B:
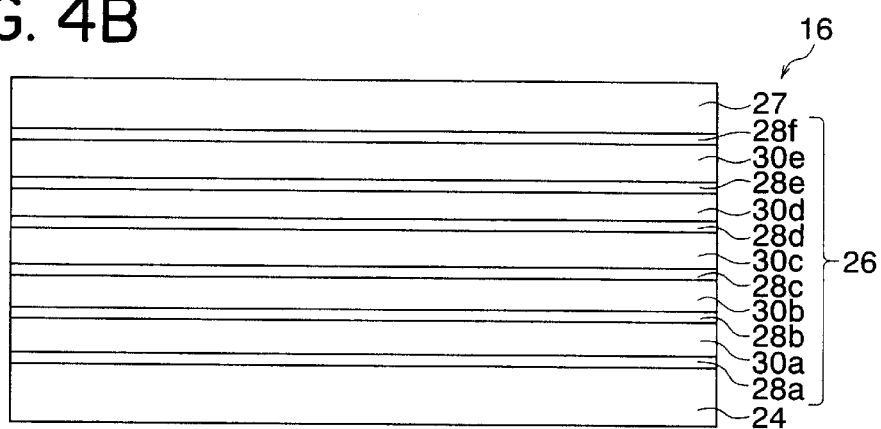

The MQW-SCH active layer structure 16, as shown in FIG. 4B which depicts the detail of the MQW-SCH active layer structure 16 after the growth step thereof, includes the bottom InGaAsP SCH layer 24 having a bandgap wavelength of 1.2 μm, the MQW active layer body 26 and the top InGaAsP SCH layer 27. The MQW active layer body 26 includes six InGaAs QW layers 28a to 28f each having a thickness of 4 nm, a fourth barrier layer 30d, as viewed from the bottom, made of AlGaInAs having a bandgap wavelength of 1.2 μm, and first through third barrier layers 30a to 30c and fifth barrier layer 30e each made of InGaAsP having a bandgap wavelength of 1.2 μm.

On the top SCH layer 27 of the layer structure, a 100-nm-thick resist film for electron-beam (EB) lithography is formed by spin-coating, followed by forming a mask 42 having a pattern for the diffraction grating by using an EB lithography system. The mask pattern defining the diffraction grating has a spatial period of about 240 nm.

Figure 4C:
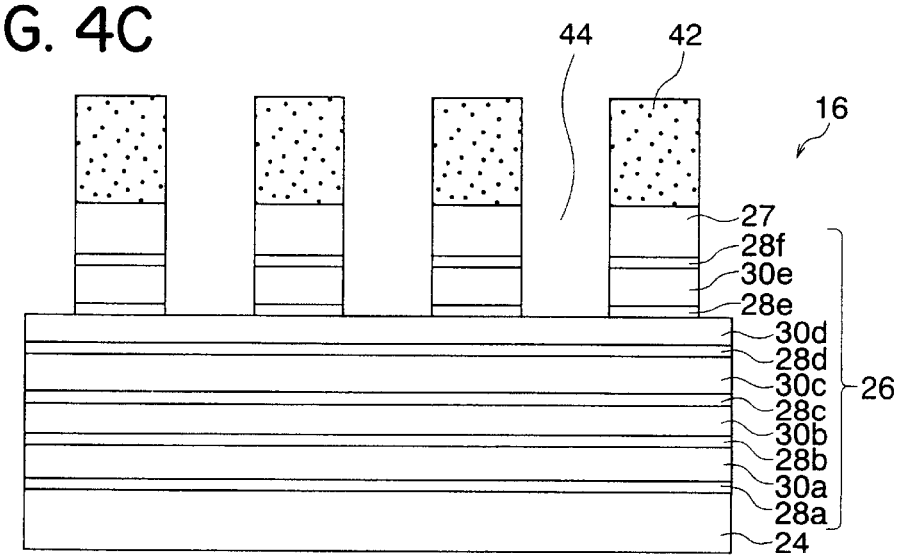

A plurality of parallel grooves 44 are then formed in the top SCH layer 27, QW layer 28f, barrier layer 30e and the QW layer 28e which overlie the barrier layer 30d by a dry etching technique using the mask 42 having the diffraction-grating pattern, as shown in FIG. 4C, thereby forming a grating structure for the diffraction grating 18. This dry etching is conducted under the following conditions:

Etching gas—$CH_4$ at a flow rate of 50 sccm, and $H_2$ at a flow rate of 100 sccm:

Total Pressure—0.1 Pa: and

Temperature—200° C.

The dry etching step using the methane/hydrogen etching gas etches the top InGaAsP SCH layer 27, InGaAsP barrier layer 30e, and the InGaAs QW layers 28e and 28f at an etching rate of about 10 nm/minute and does not substantially etch the AlGaInAs barrier layer 30d due to an extremely lower etching rate thereof.

Thus, the AlGaInAs barrier layer 30d functions as an etching stop layer, thereby stopping the etching after etching of the two QW layers 28f and 28e among the six QW layers. The etching is conducted for a longer time period than usual to obtain excellent in-plane uniformity over the wafer surface.

Figure 4D:
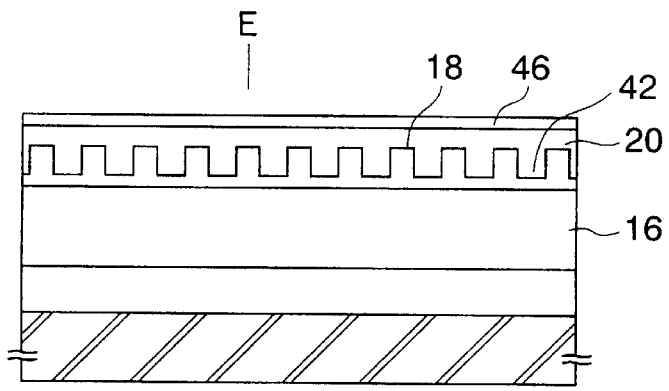

The p-InP embedded layer 20 is then grown on the diffraction grating 18 by using a MOCVD technique to fill the groove 44 of the grating structure and is embedded the diffraction grating 18, as shown in FIG. 4D. This MOCVD step is conducted at a lower temperature of about 520° C. to prevent the top portion of the MQW active layer 16 structure constituting the diffraction grating 18 from being deformed by excessive heat. A SiNx film 46 is then formed on the entire surface by using a plasma-enhanced CVD system.

Figure 4E:
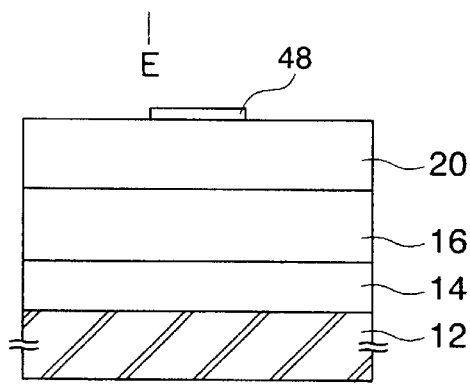

The SiNx film 46 is then patterned by using a photolithographic step and a reactive-ion etching (RIE) step to form a stripe having a width of 4 ì m and extending in the direction perpendicular to the grooves 44 of the diffraction grating 18, thereby obtaining a SiNx mask pattern 48. FIG. 4E shows the structure taken along line E—E in FIG. 4D after the RIE step.

By using the SiNx mask 48 as an etching mask, the InP embedded layer 20, MQW-SCH active layer structure including the diffraction grating 18 and the upper portion of the lower cladding layer 14 are selectively etched to form a mesa stripe having a width of 1.5 μm for the MQW active layer structure 16.

Figure 4F:
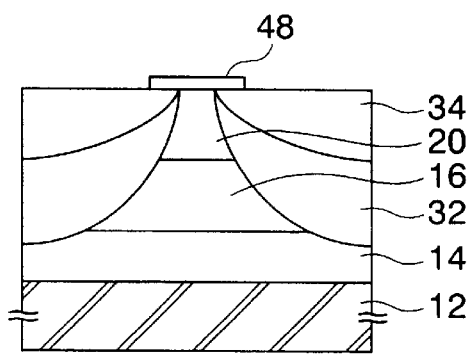
Figure 4G:
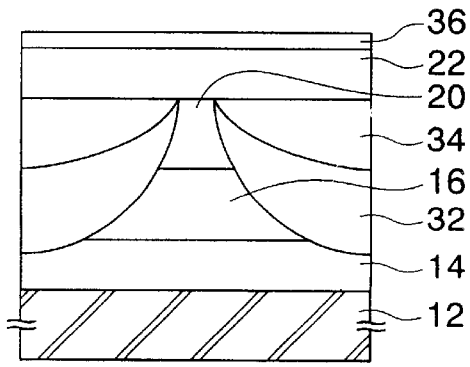

Thereafter, the same SiNx mask 48 is used as a selective growth mask to epitaxially grow p-InP layer 32 and n-InP layer 34 as a current blocking structure on each side of the mesa stripe, whereby a so-called buried-heterostructure laser device shown in FIG. 4F is obtained. After removing the SiNx mask 48, as shown in FIG. 4G, a 2-μm-thick p-InP cladding layer 22 and a heavily doped cap layer 36 are epitaxially grown on the n-InP layer 34 and the top of the mesa stripe.

The n-InP substrate 12 is then polished at the bottom surface thereof to obtain a thickness of 120 μm for the n-InP substrate 12, followed by forming a multilayer metallic film including Ti/Pt/Au layers as a p-side electrode 38 on the GaInAs cap layer 36 and forming an AuGeNi metallic film as an n-side electrode 40 on the bottom surface of the n-InP substrate 12. Thus, the DFB laser of FIG. 1 can be obtained. An anti-reflection coat and high-reflection coat (both not shown) are then formed on the front end and the rear end, respectively, of the DFB laser.

In the above embodiment, the etching stop layer is implemented by a compound semiconductor layer having therein an Al content, which has a lower etching rate in the dry etching using a methane/hydrogen gas as an etching gas compared to compound semiconductor layers having therein no Al content. The grating structure of the diffraction grating can be formed within the MQW active layer structure by incorporating the etching stop layer which also acts as a QW layer or a barrier layer in the MQW active layer structure.

The etch selectivity between the etching stop layer and the other layers to be etched depends on the etching gas used for etching and the materials for the other layers. Thus, the material for the etching stop layer should be selected in consideration of the etching gas and the materials for the other layers to be etched.

The etching for forming the diffraction grating may be a wet etching instead. However, the dry etching is more preferred because the dry etching causes little side etching and inherently achieves more excellent in-plane uniformity within the wafer surface, in a fine patterning process such as for forming the diffraction grating, compared to the wet etching.

EXAMPLES

Samples of the DFB laser device of FIG. 1 were fabricated on a wafer and subjected to measurements of the device characteristics thereof.

In the measurements, samples of DFB laser devices were selected at random from the wafer, i.e., without selecting the samples from a specific location of the wafer. The samples had threshold currents in the range between 9 mA and 11 mA, and operated for excellent single-mode lasing. The side-mode suppression ratios (SMSR) of the samples, which represent the indexes or degrees of the single-mode lasing in the laser device, resided within a range as high as between 40 dB and 50 dB. The thus large SMSR itself is the feature of the gain-coupling type DFB laser devices.

The samples selected at random from the DFB laser devices formed over the entire area of the wafer exhibited similar device characteristics, and particularly had coupling coefficients within a dispersion or variation of ±10%, which showed excellent in-plane uniformity. On the other hand, comparative samples of the conventional DFB laser device had coupling coefficients as wide a dispersion as ±20%.

Although an AlGaInAs layer is used as the etching stop layer in connection with InGaAsP and InGaAs layers in the above embodiment, another compound semiconductor layer may be used as the etching stop layer so long as the another layer has a lower etching rate compared to the InGaAsP and InGaAs layers. In addition, although the etching stop layer is implemented by a barrier layer in the MQW active layer structure in the above embodiment, a QW layer made of AlGaInAs having a peak-gain wavelength of 1550 nm may be used as the etching stop layer. In this case, since the top surface of the etching stop QW layer constitutes a boundary between the same and the re-grown embedded layer in the diffraction grating, the re-growth process should have optimum growth conditions.

Further, although a p-InP layer is used as the embedded layer in the diffraction grating in the above embodiment, the embedded layer may be a semiconductor layer having a composition similar to the composition of the barrier layers. In this case, an intrinsic gain-coupling structure for the DFB laser can be obtained. Further, the diffraction grating, which may be modified to have a different spatial period for the same depth, can be applied to an array of DFB lasers of a receptacle type.

Since the above embodiment is described only for an example, the present invention is not limited to the above embodiment and various modifications or alterations can be easily made therefrom by those skilled in the art without departing from the scope of the present invention.

What is claimed is:

1. A distributed feedback (DFB) semiconductor laser device comprising:
    a compound semiconductor substrate;
    a multiple-quantum-well (MQW) active layer structure overlying said compound semiconductor substrate, including
        a plurality of quantum well (QW) layers,
        at least one barrier layer, and
    a diffraction grating, including
        a grating structure formed in a portion of said MQW active layer structure, and
        an embedded layer (20) embedded in said grating structure, wherein
            said MQW active layer structure includes an etching stop layer that underlies and is in contact with said portion of said MQW active layer structure.

2. The DFB semiconductor laser device as defined in claim 1, wherein:
    said etching stop layer exhibits a property of having a lower dry etching rate than that for said portion of MQW active layer structure.

3. The DFB semiconductor laser device as defined in claim 1, wherein:
    said portion of said MQW active layer structure includes substantially no Al content; and
    said etching stop layer includes an Al content.

4. The DFB semiconductor laser device as defined in claim 3, wherein:
    said etching stop layer exhibits a property of having a lower dry etching rate when dry etched with a methane gas than that for said portion of said MQW active layer structure.

5. The DFB semiconductor laser device as defined in claim 1, wherein:
    said etching stop layer is one of said QW layers.

6. The DFB semiconductor laser device as defined in claim 2, wherein:
    said etching stop layer is one of said QW layers.

7. The DFB semiconductor laser device as defined in claim 3, wherein:
    said etching stop layer is one of said QW layers.

8. The DFB semiconductor laser device as defined in claim 4, wherein:
    said etching stop layer is one of said QW layers.

9. The DFB semiconductor laser device as defined in claim 1, wherein:
    said at least one barrier layer includes said etching stop layer.

10. The DFB semiconductor laser device as defined in claim 2, wherein:
    said at least one barrier layer includes said etching stop layer.

11. The DFB semiconductor laser device as defined in claim 3, wherein:
    said at least one barrier layer includes said etching stop layer.

12. The DFB semiconductor laser device as defined in claim 4, wherein:
    said at least one barrier layer includes said etching stop layer.

* * * * *